United States Patent
Nguyen (10) Patent No.: US 7,480,192 B1
(45) Date of Patent: Jan. 20, 2009

(54) PULL-UP VOLTAGE CIRCUIT

(75) Inventor: Huy Son Nguyen, Fremont, CA (US)

(73) Assignee: XILINX, Inc., San Jose, CA (US)

( * ) Notice: Subject to any disclaimer, the term of this patent is extended or adjusted under 35 U.S.C. 154(b) by 96 days.

(21) Appl. No.: 11/784,290

(22) Filed: Apr. 6, 2007

(51) Int. Cl.
*G11C 7/00* (2006.01)
*G11C 11/00* (2006.01)

(52) U.S. Cl. .................. 365/189.11; 365/203; 365/154; 365/156

(58) Field of Classification Search ............ 365/189.11, 365/203, 154, 156
See application file for complete search history.

(56) References Cited

U.S. PATENT DOCUMENTS 4,685,086 A * 8/1987 Tran ........................... 365/203
7,200,057 B2 * 4/2007 Pineda De Gyvez et al. 365/203
7,313,012 B2 * 12/2007 Chuang et al. ............... 365/154
7,385,840 B2 * 6/2008 Redwine ...................... 365/154
7,400,523 B2 * 7/2008 Houston ...................... 365/154

* cited by examiner

*Primary Examiner*—Trong Phan
(74) *Attorney, Agent, or Firm*—W. Eric Webostad (57) ABSTRACT

A pull-up voltage circuit and method for reducing power consumption therewith are described. A pull-up voltage circuit has an inverter powered by a first supply voltage. A first p-type transistor and an n-type transistor are commonly gated to receive output from a first output node of the inverter to a first input node. A source region of the n-type transistor is coupled to a ground. A drain region of each of the first p-type transistor and the n-type transistor are commonly coupled at a second output node. A second p-type transistor has a gate coupled to the second output node. A drain region of the second p-type transistor, a source region of the first p-type transistor, and an input of the inverter are all coupled to a line. A source region of the second p-type transistor is coupled to the first supply voltage.

7 Claims, 5 Drawing Sheets

PULL-UP VOLTAGE CIRCUIT

FIELD OF THE INVENTION

One or more aspects of the invention relate generally to integrated circuits and, more particularly, to a pull-up voltage circuit.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation.

One such FPGA is the Xilinx Virtex™ FPGA available from Xilinx, Inc., 2100 Logic Drive, San Jose, Calif. 95124. Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

FPGAs conventionally use a higher supply voltage for memory cells than supply voltage for surrounding circuitry. Accordingly, a pull-up voltage circuit for such memory cells may be supplied by a voltage supply having a lower voltage than the voltage supply for the memory cells. This difference in supply voltage may lead to an increase in power consumption when accessing a memory cell or memory cells. More particularly, current may be conducted from the higher supply voltage to the lower supply voltage causing excessive power consumption for a write or read operation to/from a memory cell or memory cells.

Accordingly, it would be desirable and useful to provide circuitry to reduce power consumption when accessing a memory cell associated with a supply voltage that is significantly greater than a supply voltage associated with a pull-up voltage circuit associated with such memory cells.

SUMMARY OF THE INVENTION

One or more aspects of the invention generally relate to integrated circuits and, more particularly, to a pull-up voltage circuit.

An aspect of the invention is a pull-up voltage circuit having an inverter powered by a first supply voltage. A first p-type transistor and an n-type transistor are commonly gated to receive output from a first output node of the inverter to a first input node of the first p-type transistor and the n-type transistor. A source region of the n-type transistor is coupled to a ground. A drain region of each of the first p-type transistor and the n-type transistor are commonly coupled at a second output node. A second p-type transistor has a gate coupled to the second output node. A drain region of the second p-type transistor, a source region of the first p-type transistor, and an input of the inverter are all coupled to a line. A source region of the second p-type transistor is coupled to the first supply voltage.

Another aspect of the invention is a memory device having an array of memory cells including bitlines and wordlines. Voltage pull-up circuits are for precharging the bitlines. The voltage pull-up circuits operate with a first supply voltage level and the array of memory cells operate with a second supply voltage level which is greater than the first supply voltage level. Each voltage pull-up circuit is configured to sense voltage on a respective bitline, precharge the respective bitline responsive to voltage on the respective bitline exceeding a trip voltage associated with the voltage pull-up circuit, and cease the precharging responsive to voltage on the respective bitline exceeding a reverse bias voltage. The reverse bias voltage is greater than the trip voltage and less than the first supply voltage level.

Yet another aspect of the invention is a method for reducing power consumption by powering an array of memory cells with a first supply voltage level. A bitline is precharged by gated coupling of the bitline to a second supply voltage level. The second supply voltage level is less than the first supply voltage level. A wordline voltage is applied to a wordline associated with the array of memory cells, the wordline voltage greater than the second supply voltage level. The bitline voltage is increased beyond a trip voltage level which is less than the second supply voltage level. The increasing of the bitline voltage to the trip voltage level causes a portion of the gated coupling to be in a diode-coupled mode of operation. The bitline voltage is increased beyond the trip voltage level to a reverse bias voltage level which is less than the second supply voltage level. The increasing of the bitline voltage to the reverse bias voltage level causes the portion of the gated coupling in the diode coupled mode of operation to be put in a substantially non-conductive mode.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well-known features have not been described in detail so as not to obscure the invention. For ease of illustration, the same number labels are used in different diagrams to refer to the same items; however, in alternative embodiments the items may be different.

Figure 1:
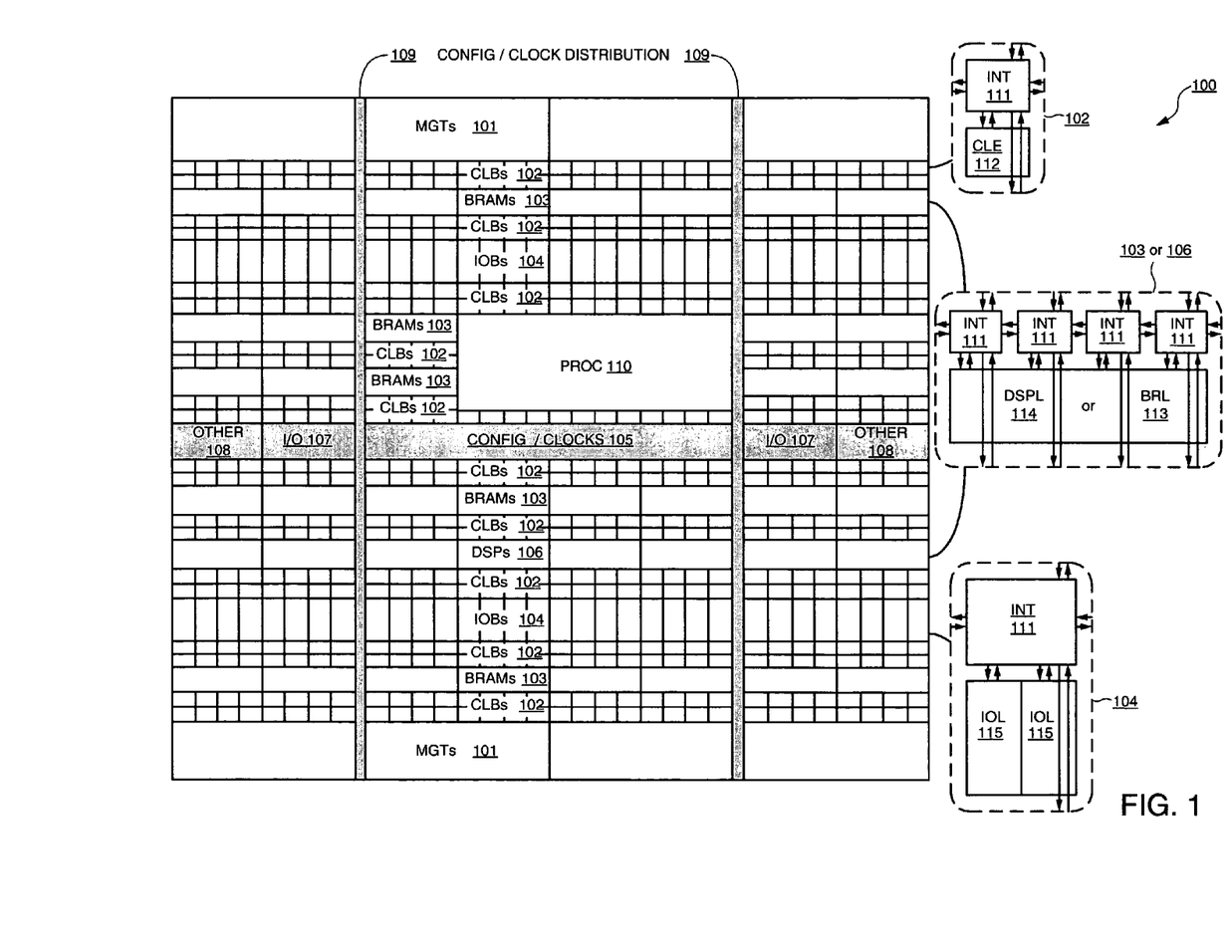
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, block random access memory ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture, though FPGAs of other architectures, such as ring architectures for example, may be used. FPGA 100 may be a Virtex™-4 FPGA from Xilinx of San Jose, Calif.

Figure 2:
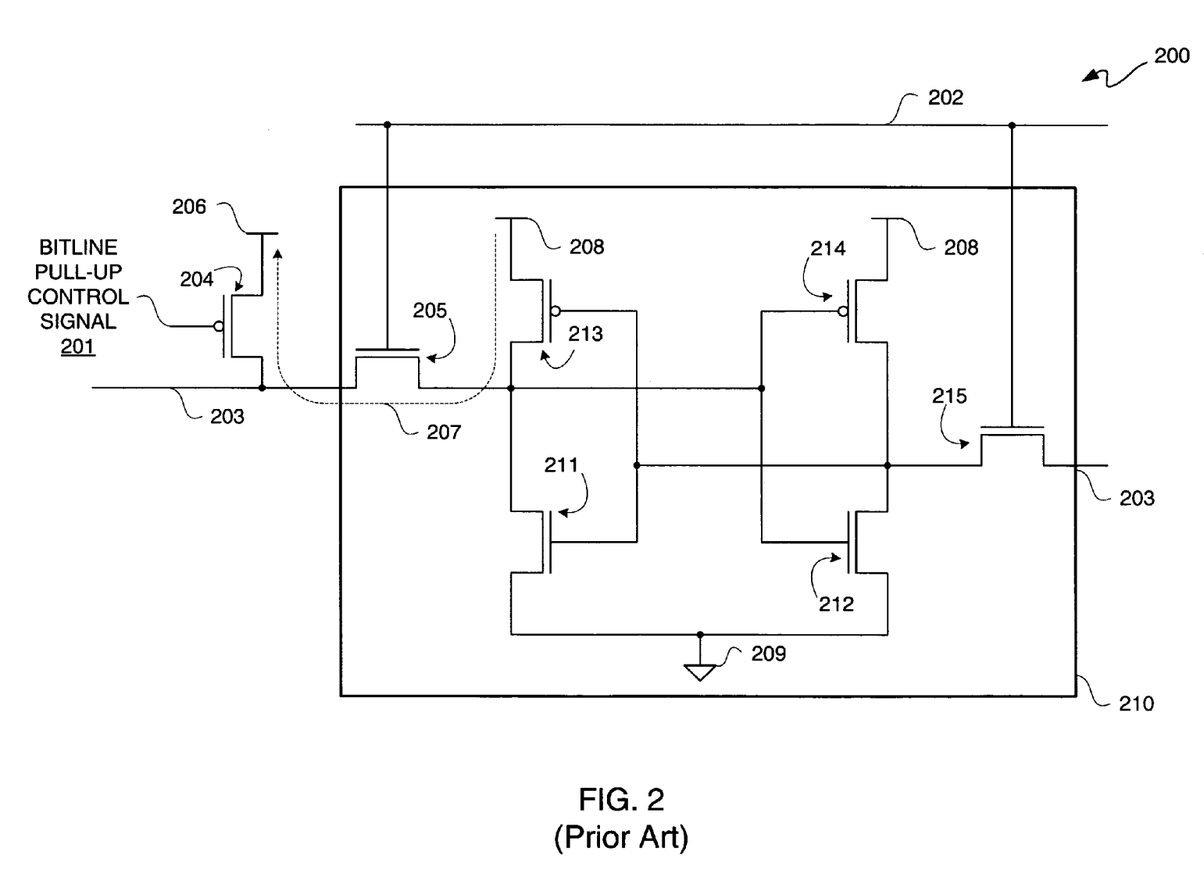
FIG. 2 is a circuit diagram depicting an exemplary embodiment of a portion of a known memory cell array.

FIG. 2 is a circuit diagram depicting an exemplary embodiment of a portion of a known memory cell array 200. Memory cell array 200 includes a plurality of memory cells, such as memory cell 210. Each bitline 203 of memory cell array 200 may be precharged to a known voltage level. In order to understand the rationale for the invention, a more complete understanding of the limitations of memory cell array 200 may be helpful.

Memory cell 210 is formed of cross-coupled inverters, where one inverter is formed of PMOS transistor 213 and NMOS transistor 211, and another inverter is formed of PMOS transistor 214 and NMOS transistor 212. Access transistors 205 and 215 are gated by wordline 202. Each bitline 203 respectively associated with access transistors 205 and 215 may be precharged, as is known. This precharging may involve pulling up a voltage to a supply voltage level or pulling down a voltage to a ground potential. For purposes of simplifying the description, only the pull-up voltage portion is described below, although a pull-down may also be used.

Heretofore, a single PMOS transistor 204 was used to provide a pull-up voltage to a bitline 203. Accordingly, a source node of transistor 204 may be coupled to a supply voltage 206 and a drain node of transistor 204 may be coupled to a bitline 203. A bitline pull-up control signal 201 may be applied to a gate of transistor 204 to either turn transistor 204 into a substantially conductive or substantially nonconductive state for applying or not applying, respectively, supply voltage 206 to bitline 203.

As is known, cross coupled inverters of memory cell 210 may be biased between ground 209 and a supply voltage 208, where supply voltage 208 may be substantially higher than supply voltage 206. Accordingly, when transistor 205 is in a conductive state, leakage current may pass through transistors 213, 205, and 204 from supply voltage 208 to supply voltage 206, as generally indicated by dashed line 207.

More particularly, for a write to memory cell 210, wordline 202 is raised to a sufficiently high voltage to overcome a voltage divider caused by transistors 214 and 215. For purposes of clarity by way of example and not limitation, examples of voltages are used though it should be understood that other voltage levels may be used. For example, supply voltage 208 may be at approximately 1.5 volts and supply voltage 206 may be at approximately 0.75 volts. Wordline 202 may be raised to approximately 1.4 volts for a write operation to memory cell 210. For 1.4 volts on wordline 202, access transistor 205, as well as access transistor 215, are put in a substantially conductive state. Notably, for purposes of clarity and not limitation, only the pull-up side of memory cell 210 is described.

For access transistor 205 in a substantially conductive state, a steady-state current may flow from supply voltage 208 to supply voltage 206, again as generally indicated by dashed line 207, for a write operation to memory cell 210. Notably, a PMOS transistor (and not an NMOS transistor) is typically used for charging bitlines, as NMOS transistor usage may have a significant drawback. More particularly, for an NMOS pull-up transistor, as bitline voltage increases, the gate-to-source voltage of such NMOS transistor is reduced, which leads to a quadratic reduction in the charging current. Use of NMOS transistors as pull-up devices is well known, and limitations associated with use of such devices in conjunction with memory cell 210 are equally well known, and thus are not described herein for purposes of clarity. Other details regarding memory cell array 200 are known to those of ordinary skill in the art, and thus are not described herein for purposes of clarity.

Figure 3:
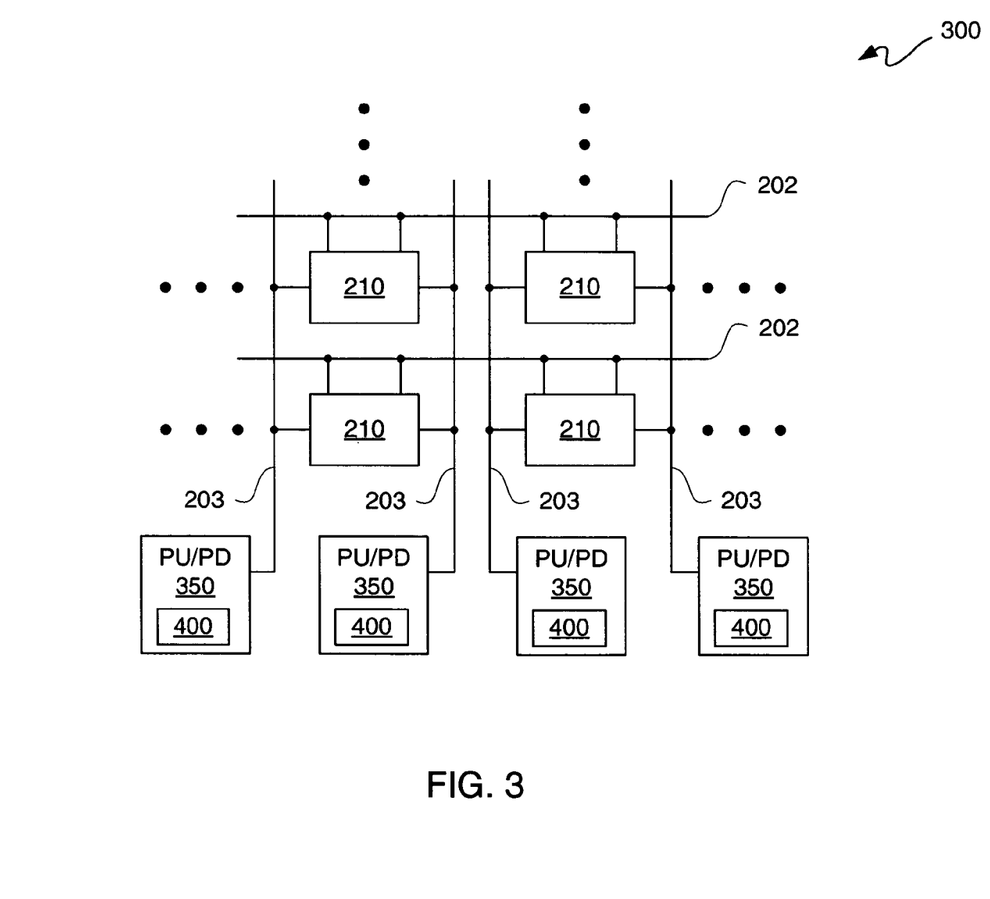
FIG. 3 is a block diagram depicting an exemplary embodiment of a portion of memory cell array.

FIG. 3 is a block diagram depicting an exemplary embodiment of a portion of a memory cell array 300. Memory cell array 300, like memory cell array 200 of FIG. 2, includes memory cells 210 coupled to wordlines 202 and bitlines 203 in a known manner. However, each pull-up/pull-down circuit block 350 associated with bitlines 203 includes a voltage sensing, shut-off circuit 400, as described below in additional detail.

As is known, bitlines are precharged prior to raising voltage on a wordline, such as for purposes of a read or a write operation. Accordingly, for precharging a pair of bitlines 203, one of such bitlines associated with a memory cell 210 may be pulled up toward a logic level 1 voltage and the other of such bitlines may be pulled down toward a logic level 0 voltage. After precharging of bitlines 203, wordline 202, which was previously at a logic low level voltage, is pulled up toward an access level voltage. Again, for purposes of clarity by way of example and not limitation, specific voltage values are used though it shall be appreciated that other voltage values than these specific examples may be used. Thus, for example, a wordline 202 may be pulled up to approximately 1.4 volts after bitline pairs 203 have been pulled up and pulled down to approximately 0.75 volts and approximately 0 volts, respectively.

Notably, depending on implementation, wordline 202 voltage level may be less than, equal to, or greater than supply voltage 208 level of the memory cell array. For wordline 202 voltage being less than or equal to the sum of supply voltage 208 and one NMOS threshold voltage associated with NMOS transistors of the memory cell array, the drain region of access transistor 205, namely the source/drain region of access transistor connected to bitline 203-1, will rise to one NMOS threshold voltage below wordline 202 voltage, at which point access transistor 205 turns off. In brief, access transistor 205 turns off because its gate voltage is no longer one NMOS threshold voltage above at least one of its drain voltage or its source voltage. Although this appears as a gate-to-drain voltage coupling for access transistor 205, access transistor 205 does not actually couple gate-to-drain voltages as that would be inconsistent with normal operation of an NMOS transistor. If wordline 202 voltage is greater than supply voltage 208 plus one NMOS threshold voltage, bitline 203-1 voltage will rise to the voltage level of supply voltage 208 present at the source region of access transistor 205, namely present at node 403 (see FIG. 4). This is because the gate voltage of access transistor 205 will be greater than at least one of the drain voltage or source voltage of access transistor 205 by one NMOS threshold voltage. In this condition, source and drain regions of access transistor 205 are coupled by an induced channel region therebetween such that supply voltage 208 at node 403 is conducted via such induced channel from source-to-drain of access transistor 205 for bitline 203-1.

Figure 4:
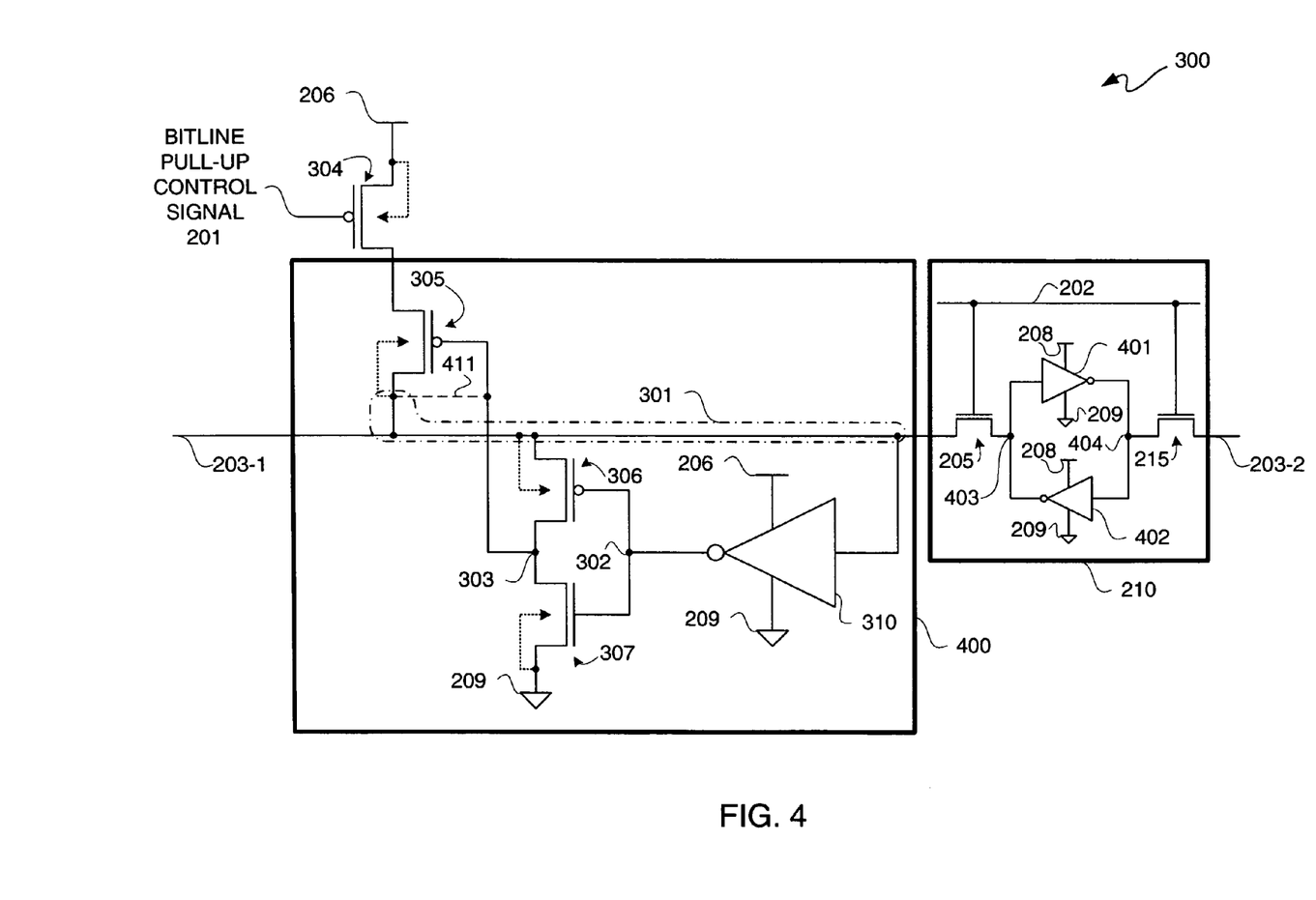
FIG. 4 is a circuit diagram depicting an exemplary embodiment of memory cell array including a more detailed view of voltage-sensing, shut-off circuit ("VSSC").

FIG. 4 is a circuit diagram depicting an exemplary embodiment of memory cell array 300 including a more detailed view of voltage-sensing, shut-off circuit ("VSSC") 400. As shall be described below in additional detail, VSSC 400 includes PMOS transistors 305 and 306, NMOS transistor 307, and inverter 310.

Assuming bitline 203-1 is precharged toward approximately 0.75 volts by providing a logic low level voltage via bitline pull-up control signal 201 to a gate of p-channel transistor 304 and assuming that bitline 203-2 is pulled down to approximately 0 volts, then wordline 202 may be raised to 1.4 volts. Notably, due to the transistor threshold voltage of PMOS transistor 305, bitline 203-1 is not pulled up to 0.75 volts during precharging. Instead, bitline 203-1 only reaches 0.75 volts when wordline 202 voltage is raised, as described below in additional detail. Accordingly, it should be appreciated that the bitline 203-1 precharge voltage in this example is 0.75 volts minus a PMOS threshold voltage of PMOS transistor 305.

Both PMOS transistors 304 and 305 in a conductive state for coupling of 0.75 volts from voltage supply 206 to precharge bitline 203-1. After precharging to a sufficient precharge voltage level, wordline 202 voltage is raised. For wordline 202 raised to 1.4 volts, access transistors 205 and 215 are effectively switched from off states to on states, and thus nodes 403 and 404 of memory cell 210 are virtually or effectively connected to bitlines 203-1 and 203-2, respectively, via access transistors 205 and 215, respectively.

Continuing the example, assume that prior to this access of memory cell 210, node 403 was approximately at 0 volts and node 404 was approximately at 1.5 volts. Accordingly, application of sufficient voltage to bitline 203-1 coupled to node 403 and application of 0 volts to bitline 203-2 coupled to node 404 will effectively pull-up and pull down, respectively, those nodes. This will cause output of inverter 401 to go from a logic high level voltage of approximately 1.5 volts to a logic low level voltage of approximately 0 volts, and will cause output of inverter 402 to go from a logic low level voltage of approximately 0 volts to a logic high level voltage of approximately 1.5 volts. Application of 1.5 volts as sourced from supply voltage 208 via inverter 402 applied to node 403, which is effectively coupled to bitline 203-1 via transistor 205 being in a substantially conduction state, causes voltage on bitline 203-1 to increase. When voltage on bitline 203-1 is raised past a trip point voltage of inverter 310, VSSC 400 automatically switches PMOS transistor 305 from an on or substantially conductive state to an off or substantially non-conductive state.

Prior to precharging bitline 203-1 and thus turning on PMOS transistor 304, it should be appreciated that bitline 203-1 may be at approximately 0 volts. At 0 volts, input to inverter 310, which is coupled to bitline 203-1, causes output of inverter 310 to be a logic high voltage level. As inverter 310 is biased by supply voltage 206, which continuing the example may be 0.75 volts, output of inverter 310 is a logic high level of approximately 0.75 volts. A gate of PMOS transistor 306 and a gate of NMOS transistor 307 are coupled at an input node 302 to receive output of inverter 310. Additionally, PMOS transistor 306 and NMOS transistor 307 have commonly coupled drains at output node 303. For application of approximately 0.75 volts to gates of transistors 307 and 306, NMOS transistor 307 is effectively switched to an on condition and PMOS transistor 306 is effectively switched to an off condition. For NMOS transistor 307 having a source coupled to ground 209 and a drain coupled to an output node 303, which is coupled to a gate of PMOS transistor 305, transistor 305 is in an on condition. In short, transistor 305 is in an on condition when bitline 203-1 is at 0 volts.

Notably, a body region of NMOS transistor 307 may be coupled to ground 209, as illustratively shown in FIG. 4 by a dotted line. Whether this body coupling is implemented may depend upon the semiconductor technology used. For example, in non-silicon-on-insulator or non-SOI implementations, this back body coupling may be used. However, in SOI implementation, such back body coupling could be omitted. Furthermore, respective body regions of PMOS transistors 305 and 306 may optionally be coupled to bitline 203-1, also as illustratively shown in FIG. 4 by doffed lines. Again, whether these body couplings are implemented may depend upon the semiconductor technology used, namely whether a non-SOI or SOI implementation is used. Thus, an implementation should be capable of raising body region voltage of PMOS transistors 305 and 306 to a bitline 203-1 voltage level, as described herein.

Returning to the example of application of 1.4 volts to wordline 202, and assuming a threshold voltage drop of approximately 0.2 volts for access transistor 205, it should be appreciated that bitline 203-1 may charge up to 1.2 volts. However, recall that PMOS transistor 305 is shut off when bitline 203-1 voltage exceeds a trip point voltage of inverter 310.

Thus, if PMOS transistors 304 and 305 are both turned on pulling up voltage on bitline 203-1, a logic high level voltage reached on bitline 203-1 is dependent at least in part on the trip point voltage of inverter 310. Generally, it may be desirable to have the bitline voltage on bitline 203-1 reach as high a voltage level as possible prior to tripping inverter 310 and thus, it may be desirable to set the trip point voltage of inverter 310 as close to its supplied voltage as possible, which in this example is 0.75 volts. Assuming inverter 310 consists of a PMOS transistor and an NMOS transistor, as is known, there is a threshold voltage associated with each of such transistors. For purposes of clarity by way of example and not limitation, it shall be assumed that the threshold voltages of the NMOS and PMOS transistors used to provide inverter 310 are the same voltage level as each other.

The trip point voltage of the inverter 310 is greater than or equal to the threshold voltage of the NMOS transistor and less than or equal to the supply voltage level minus the threshold voltage of the PMOS transistor. For purposes of clarity by way of example, it shall be assumed that the trip point voltage of inverter 310 is approximately 0.50 volts. Furthermore, it was described that bitline voltage is pulled up toward 0.75 volts by coupling voltage supply 206 to bitline 203-1 via PMOS transistors 304 and 305 both being in a substantially conductive state. The gate of PMOS transistor 304 is at 0 volts, which is 0.75 volts below its source voltage. Thus, PMOS transistor 304 stays in a conductive state as long as control signal 201 is asserted, namely 0 volts, and thus there is no threshold voltage drop for PMOS transistor 304 to be considered. On the other hand, once PMOS transistor 305 effectively becomes a diode, namely when virtual coupling 411 is active, any increase in bitline 203-1 voltage reduces the source-to-gate voltage of PMOS transistor 305 until its gate is within a threshold voltage below its source voltage. When the gate of PMOS transistor 305 is within a threshold voltage below its source voltage, PMOS transistor 305 stops conducting.

Accordingly, bitline 203-1 may be charged up to 0.55 volts. As 0.55 volts is higher than the trip point voltage of inverter 310, inverter 310 goes from outputting a logic high voltage of approximately 0.75 volts to outputting a logic low voltage of approximately 0 volts. Application of 0 volts to node 302 causes NMOS transistor 307 to be switched off and causes PMOS transistor 306 to be switched on. Thus, after precharging and prior to application of a wordline voltage, output of inverter 310 is switched to turn off transistor 307 and turn on transistor 306. Notably, the trip point voltage of inverter 310 is reached without help from or prior to application wordline voltage.

For PMOS transistor 306 in a substantially conductive state, PMOS transistor 306 effectively couples bitline 203-1 to node 303. This effective coupling may be assisted by back body biasing PMOS transistor 306 by coupling a body region thereof to bitline 203-1. Accordingly, it should be appreciated that a drain region of PMOS transistor 305 is effectively coupled to node 303. By having a virtual coupling as generally indicated by dashed line 411, PMOS transistor 305 is put in a diode-connected or diode-coupled mode of operation. In other words, it should be appreciated that by this virtual coupling, the bitline voltage of bitline 203-1 and the voltage at node 303 are equalized, causing PMOS transistor 305 to be put in a diode-connected mode of operation with a node associated with bitline 203-1, namely node 301 as illustratively shown by a dashed and dotted line, acting as a negative terminal for such diode-connected mode of operation of PMOS transistor 305. Notably, this diode-connected mode of operation may be assisted by back body biasing PMOS transistor 305 by coupling a body region thereof to bitline 203-1.

Access transistor 205 may be switched to an on state by application of 1.4 volts to wordline 202, and bitline 203-1 will continue to charge up toward 1.2 volts. Accordingly, the bitline voltage as applied to a gate region, a drain region, and in this example a body region, of PMOS transistor 305 continues to rise or be pulled up by application of wordline voltage. Furthermore, voltage on bitline 203-1 continues to be pulled up by PMOS transistor 305 in the diode-connected mode of operation until the bitline voltage is within a PMOS threshold voltage from the source voltage of PMOS transistor 305.

For example, if PMOS transistor 305 has a threshold voltage of 0.2 volts, and source voltage is 0.75 volts, then if bitline voltage were greater than or equal to 0.55 volts, PMOS transistor 305 would be switched off, namely in a substantially not conductive state. Notably, there is no appreciable voltage drop for PMOS transistor 304. PMOS transistor 305 will continue to be off as bitline voltage is pulled even further toward the supply voltage level of voltage supply 208, or more particularly toward the voltage level applied on wordline 202 for a write operation for example.

If both the body of PMOS transistor 305 and the body of PMOS transistor 306 are coupled to 0.75 volts but are not coupled to bitline 203-1, then when bitline 203-1 voltage is raised to 1.2 volts as describe above, a p-type implant region/ N-well junction of each of PMOS transistors 305 and 306 would be forward biased. Notably, forward biasing these p-type implant region/N-well junctions may allow for an undesirable parasitic current through these junctions. However, by coupling body regions of PMOS transistors 305 and 306 to bitline 203-1, this forward biasing may be avoided.

In other words, for drain and gate voltage, as well as body voltage, of PMOS transistor 305 being within a PMOS threshold voltage from the source voltage of PMOS transistor 305, PMOS transistor 305, which was in a diode-connected mode of operation, is effectively reserve biased. In this condition, the steady-state current as generally indicated by dashed line 207 of FIG. 2 is eliminated or at least substantially reduced. Because quadratic dependency of bitline charging current on bitline voltage is avoided, application of bitline pull-up voltage may be more forceful for use in a memory write operation.

Figure 5:
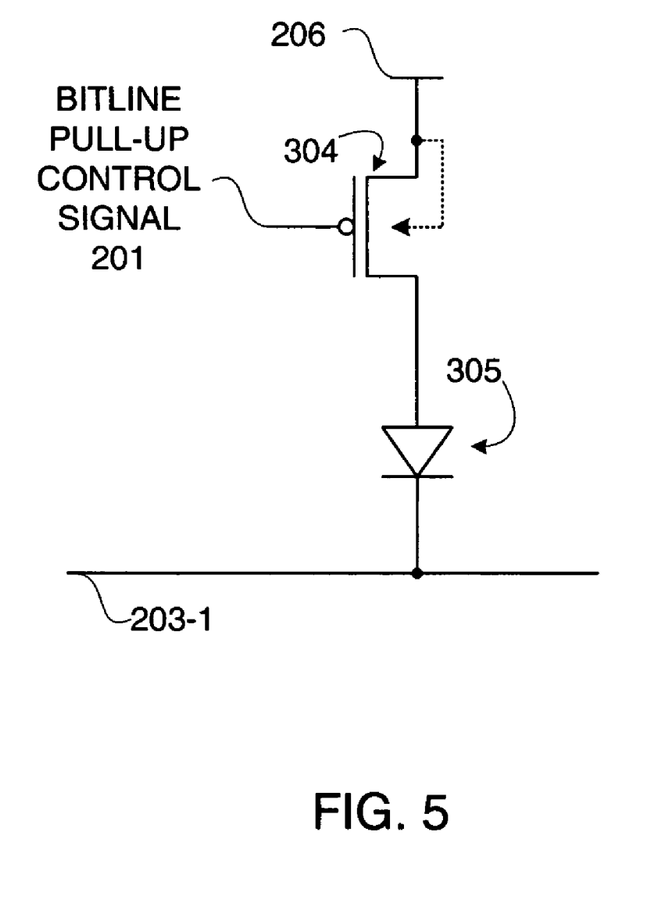
FIG. 5 is a circuit diagram depicting an exemplary embodiment of a diode-connected mode of operation for a PMOS transistor.

FIG. 5 is a circuit diagram depicting an exemplary embodiment of a diode-connected mode of operation for PMOS transistor 305. With continuing reference to FIGS. 4 and 5, such diode-connected mode of operation is further described.

Continuing the above example of the trip point voltage of inverter 310 being set at 0.5 volts, then as bitline voltage on bitline 203-1 is equal to or just beyond the trip point voltage, output of inverter 310 causes PMOS transistor 306 to be switched on and puts PMOS transistor 305 into the above-described diode-connected mode of operation. PMOS transistor 305 stays in the diode-connected mode of operation facilitating voltage on bitline 203-1 to continue to be pulled up by supply voltage 206. However, once bitline voltage reaches one threshold voltage less than source voltage of transistor 305, then PMOS transistor 305 is substantially shut off. In the above example, once bitline voltage of bitline 203-1 is equal to 0.55 volts or slightly greater, PMOS transistor 305 is at least substantially not conductive. In other words, diode 305 may be thought of as being reserve biased once drain voltage is at most one threshold voltage level less than source voltage of PMOS transistor 305. It should be further appreciated that as voltage on bitline 203-1 continues to rise, such as due to application of wordline voltage from wordline 202, PMOS transistor 305 is further clamped to further preclude leakage current.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. For example, even though static random access memory cells of an FPGA have been described, any application of a pull-up voltage as applied for a circuit having a significantly higher supply voltage than surrounding circuitry may implemented a pull-up voltage circuit as described herein. Furthermore, even though memory internal to an FPGA has been described, it should be appreciated that memory as a standalone device or as embedded in an integrated circuit may be used. Claim(s) listing steps do not imply any order of the steps. Trademarks are the property of their respective owners.

What is claimed is:

1. A memory device having an array of memory cells including bitlines and wordlines, comprising:
   voltage pull-up circuits for precharging the bitlines;
   the voltage pull-up circuits operating with a first supply voltage level;
   the array of memory cells operating with a second supply voltage level greater than the first supply voltage level;
   wherein each voltage pull-up circuit is configured to:
      sense voltage on the respective bitline;
      precharge the respective bitline responsive to voltage on the respective bitline exceeding a trip voltage associated with the voltage pull-up circuit; and
      cease precharging responsive to voltage on the respective bitline exceeding a reverse bias voltage, the reverse bias voltage being greater than the trip voltage and less than the first supply voltage level.

2. The memory device according to claim 1, wherein each memory cell includes at least one access transistor; and
   wherein responsive to application of a wordline voltage to the wordlines, the access transistors of the memory cells respectively couple the wordline voltages to precharged bitlines of the bitlines, the wordline voltages greater than the first supply voltage level.

3. The memory device according to claim 2, wherein the wordline voltages are less than or equal to the second supply voltage level.

4. The memory device according to claim 3, wherein each voltage pull-up circuit is further configured to provide additional voltage clamping responsive to voltage on the respective bitline exceeding the reverse bias voltage and continuing to rise toward the respective wordline voltage; and
   wherein the reverse bias voltage is approximately one PMOS threshold voltage less than the first supply voltage level.

5. The memory device according to claim 4, wherein the memory device is a standalone integrated circuit.

6. The memory device according to claim 4, wherein the memory device is embedded in an integrated circuit.

7. The memory device according to claim 4, wherein the memory device is block random access memory of a programmable logic device.

* * * * *